United States Patent
Yuan et al.

(10) Patent No.: US 9,680,420 B2
(45) Date of Patent: Jun. 13, 2017

(54) APPARATUS FOR COMPENSATION OF ELECTRONIC CIRCUITRY AND ASSOCIATED METHODS

(71) Applicant: Silicon Laboratories Inc., Austin, TX (US)

(72) Inventors: Gang Yuan, Austin, TX (US); Matthew Powell, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/869,924

(22) Filed: Sep. 29, 2015

(65) Prior Publication Data

US 2017/0093342 A1    Mar. 30, 2017

(51) Int. Cl.
*H03F 1/14* (2006.01)
*H03F 1/26* (2006.01)
*H03F 3/45* (2006.01)
*H03F 1/08* (2006.01)

(52) U.S. Cl.
CPC ........... *H03F 1/26* (2013.01); *H03F 3/45179* (2013.01); *H03F 1/083* (2013.01); *H03F 1/086* (2013.01); *H03F 2203/45116* (2013.01)

(58) Field of Classification Search
CPC ..... H03F 1/36; H03F 1/08; H03F 1/16; H03F 1/34; H03F 1/24; H03F 1/50; H03F 1/14; H03F 3/343; H03F 1/086; H03F 1/083; H03F 3/45; H03F 2003/4504; H03F 2003/45049
USPC ...... 330/75, 76, 99, 100, 253, 260, 291, 292
See application file for complete search history.

(56) References Cited

U.S. PATENT DOCUMENTS

| | | | | | |
|---|---|---|---|---|---|
| 4,559,502 | A * | 12/1985 | Hiujsing | ................. | H03F 1/083 330/109 |
| 5,155,447 | A * | 10/1992 | Huijsing | ................. | H03F 1/083 330/107 |
| 5,486,790 | A * | 1/1996 | Huijsing | ................. | H03F 1/086 330/107 |
| 6,208,206 | B1 * | 3/2001 | Leung | .................... | H03F 1/086 330/100 |
| 6,542,030 | B2 * | 4/2003 | Huijsing | ................. | H03F 1/083 330/252 |

(Continued)

OTHER PUBLICATIONS

Leung et al., *Analysis of Multistage Amplifier-Frequency Compensation*, 48 IEEE Transactions on Circuits and Sys. 1041-56 (2001).

(Continued)

*Primary Examiner* — Khanh V Nguyen
(74) *Attorney, Agent, or Firm* — Law Offices of Maximilian R. Peterson

(57) ABSTRACT

An apparatus includes a multi-stage amplifier. The multi-stage amplifier includes first, second, and third amplifier circuits coupled in a cascade configuration. The multi-stage amplifier further includes first, second, and third compensation networks. The first compensation network is coupled between the output of the third amplifier circuit and the input of the second amplifier circuit. The second compensation network is coupled between the output of the third amplifier circuit and the input of the third amplifier circuit. The third compensation network is coupled between the output of the second amplifier circuit and the input of the second amplifier circuit.

20 Claims, 9 Drawing Sheets

(56) References Cited

U.S. PATENT DOCUMENTS

| | | | | |
|---|---|---|---|---|
| 6,573,791 | B2 * | 6/2003 | Sridhar | H03F 1/083 330/100 |
| 6,590,448 | B1 * | 7/2003 | Burt | H03F 3/45071 257/207 |
| 7,292,098 | B2 * | 11/2007 | Chen | H03F 1/08 330/109 |
| 7,495,422 | B2 * | 2/2009 | Mok | G05F 1/575 323/280 |
| 7,724,080 | B2 * | 5/2010 | Luff | H03F 3/393 327/124 |
| 7,973,605 | B2 | 7/2011 | Dasgupta | |

OTHER PUBLICATIONS

Lee et al., *Active-Feedback Frequency Compensation Technique for Low-Power Multistage Amplifiers*, 38 IEEE J. Solid-State Circuits 511-20 (2003).

* cited by examiner

US 9,680,420 B2

APPARATUS FOR COMPENSATION OF ELECTRONIC CIRCUITRY AND ASSOCIATED METHODS

TECHNICAL FIELD

The disclosure relates generally to compensation of electronic circuitry and, more particularly, to apparatus for compensation of electronic circuitry, such as amplifiers, and associated methods.

BACKGROUND

Digital circuits and techniques have proliferated over time and have become ubiquitous with advances in semiconductor processing, circuit and system techniques, etc. The world and phenomena in nature, however, include analog quantities. Sensing, detecting, and processing the analog quantities entails using a variety of analog circuitry.

An example of such analog circuitry is amplifiers. As supply voltages have shrunk, the use of multi-state amplifiers has tended to become more widespread. Typically, amplifiers, including multi-state amplifiers, use compensation networks to provide improved stability as a function of input signal characteristics, such as frequency.

The description in this section and any corresponding figure(s) are included as background information materials. The materials in this section should not be considered as an admission that such materials constitute prior art to the present patent application.

SUMMARY

A variety of apparatus and associated methods are disclosed and contemplated for compensating multi-stage amplifiers. According to an exemplary embodiment, an apparatus includes a multi-stage amplifier. The multi-stage amplifier includes first, second, and third amplifier circuits coupled in a cascade configuration. The multi-stage amplifier further includes first, second, and third compensation networks. The first compensation network is coupled between the output of the third amplifier circuit and the input of the second amplifier circuit. The second compensation network is coupled between the output of the third amplifier circuit and the input of the third amplifier circuit. The third compensation network is coupled between the output of the second amplifier circuit and the input of the second amplifier circuit.

According to another exemplary embodiment, a multi-stage amplifier includes first, second, and third amplifier circuits, and first, second, and third capacitors. The first amplifier circuit has first and second inputs and an output. The first amplifier circuit is coupled to receive an input signal of the compensated multi-stage amplifier at the first input of the first amplifier circuit. The second amplifier circuit has first and second inputs and an output. The first input of the second amplifier circuit is coupled to the output of the first amplifier circuit. The third amplifier circuit has an input and an output. The input of the third amplifier circuit is coupled to the output of the second amplifier circuit. The output of the third amplifier circuit provides an output signal of the multi-stage amplifier. The first capacitor is coupled between the output of the third amplifier circuit and the first input of the second amplifier circuit. The second capacitor is coupled between the output of the third amplifier circuit and the input of the third amplifier circuit, and the third capacitor is coupled between the output of the second amplifier circuit and the second input of the second amplifier circuit.

According to another exemplary embodiment, a method of compensating a multi-stage amplifier is provided. The multi-stage amplifier includes first, second, and third amplifier circuits coupled in a cascade configuration. The method includes compensating the multi-stage amplifier by using a first compensation network coupled between the output of the third amplifier circuit and the input of the second amplifier circuit, and compensating the multi-stage amplifier by using a second compensation network is coupled between the output of the third amplifier circuit and the input of the third amplifier circuit. The method further includes compensating the multi-stage amplifier by using a third compensation network coupled between the output of the second amplifier circuit and the input of the second amplifier circuit.

BRIEF DESCRIPTION OF THE DRAWINGS

The appended drawings illustrate only exemplary embodiments and therefore should not be considered as limiting the scope of the application or the claims. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to compensation of electronic circuitry. More specifically, the disclosed concepts provide apparatus and methods for compensation of electronic circuitry, such as multi-stage amplifiers.

Figure 1:
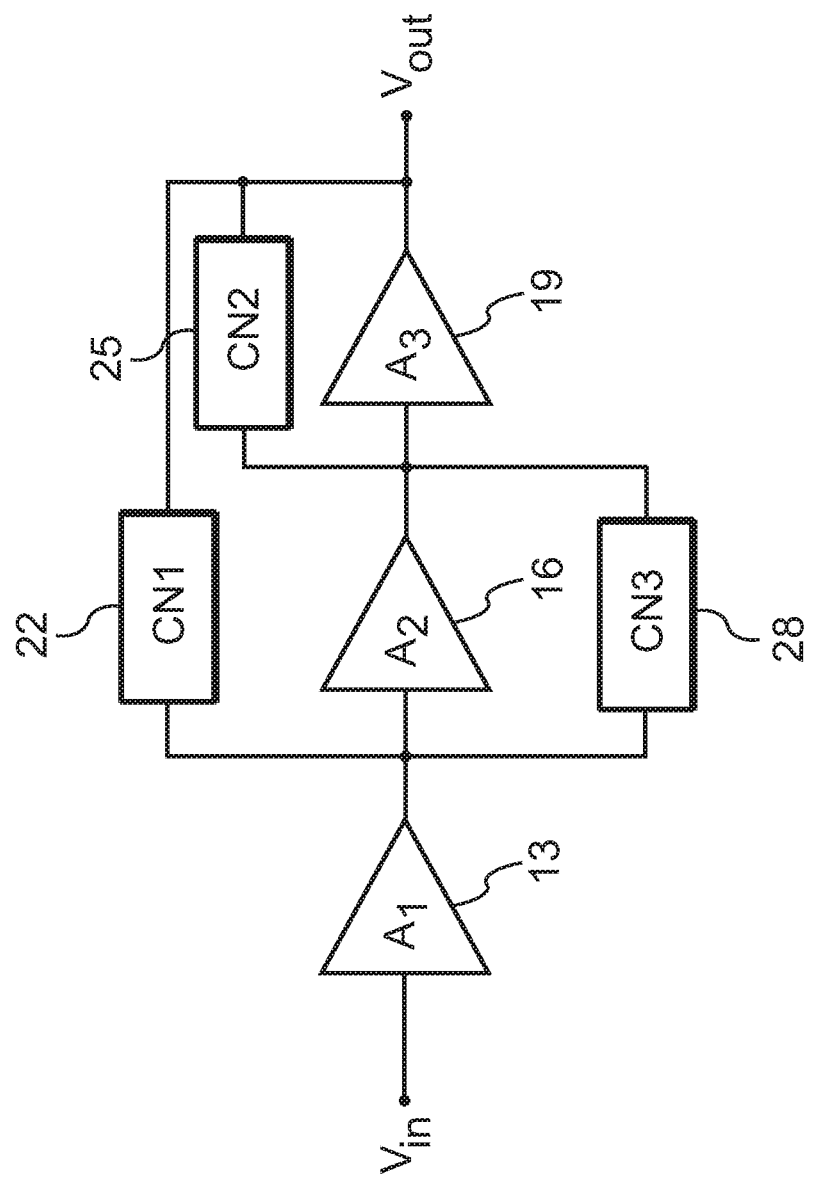
FIG. 1 illustrates a block diagram of a compensated multi-stage amplifier according to an exemplary embodiment.

FIG. 1 illustrates a block diagram of a multi-stage amplifier according to an exemplary embodiment. The multi-stage amplifier in FIG. 1 is compensated using three compensation networks, as described below in detail.

Referring to FIG. 1, the multi-stage amplifier includes three amplification or amplifier stages (or circuits or blocks, interchangeably). Specifically, the multi-stage amplifier includes amplifier circuit 13 (labeled as "A1"), amplifier circuit 16 (labeled as "A2"), and amplifier circuit 19 (labeled as "A3"). Note that amplifier circuit 13, amplifier circuit 16, and amplifier circuit 19 are DC coupled in a cascade configuration.

In exemplary embodiments, amplifier circuit 13 has rail-to-rail capability, i.e., amplifier circuit 13 can accommodate input signal swings between the supply voltage and ground potential (or between positive and negative supply voltages, if dual supplies are used). In exemplary embodiments, amplifier circuit 13 includes a differential pair. In exemplary embodiments, amplifier circuit 19 may have a class AB configuration.

In exemplary embodiments, amplifier circuits 13, 16, and 19 may provide gain and, thus, contribute to the overall gain of the multi-stage amplifier in FIG. 1. For example, in some embodiments, one or more of amplifier circuits 13, 16, and 19 may provide voltage gain, i.e., provide a larger output voltage than its respective input voltage. In some embodiments, however, the gain may be unity, that is, one or more of amplifier circuits 13, 16, and 19 may function as a unity-gain buffer (or simply buffer), as persons of ordinary skill in the art will understand.

As another example, in some embodiments, one or more of amplifier circuits 13, 16, and 19 may provide current gain, i.e., provide a larger output current than its respective input current. As another example, in some embodiments, one or more of amplifier circuits 13, 16, and 19 may provide power gain, i.e., provide a larger output power than its respective input power.

As yet another example, combinations of types of amplifier may be used in some embodiment. For example, one or more of amplifier circuits 13, 16, and 19 may provide voltage gain, whereas one or more of amplifier circuits 13, 16, and 19 may provide current or power gain, etc., as persons of ordinary skill in the art will understand.

In some embodiments, one or more of amplifier circuits 13, 16, and 19 may constitute an operational amplifier. In some embodiments, one or more of amplifier circuits 13, 16, and 19 may constitute a transconductance amplifier having a respective transconductance gm. Transconductance relates the output voltage of such an amplifier to its input current, as persons of ordinary skill in the art understand. In some embodiments, one or more of amplifier circuits 13, 16, and 19 may constitute an operational transconductance amplifier (OTA), as desired.

Other arrangements, numbers, configurations, and/or types of amplifier circuits 13, 16, and 19 are possible and are contemplated. For example, in some embodiments, different types of amplifier, such as operational amplifiers and OTAs, may be used in a multi-stage amplifier. Other variations may also be used, as persons of ordinary skill in the art will understand.

Referring back to FIG. 1, the multi-stage amplifier includes compensation networks 22, 25, and 28 (marked "CN1," "CN2," and "CN3," respectively). In the embodiment shown, compensation network 22 is coupled between the output of amplifier circuit 19 and input of amplifier circuit 16. Compensation network 25 is coupled between the output and input of amplifier circuit 19. Finally, compensation network 28 is coupled between the output and input of amplifier circuit 16.

Compensation networks 22, 25, and 28 provide compensation for the multi-stage amplifier. By virtue of the compensation provided by compensation networks 22, 25, and 28, the multi-stage amplifier has improved stability, i.e., increased gain margin and/or increased phase margin.

Use of compensation network 28 reduces the noise level of the multi-stage amplifier (compared to when compensation network 28 is not used) while providing stability of the multi-stage amplifier, as described below in more detail. Furthermore, use of compensation network 28 decomposes a right-hand-plan zero or right-hand-zero (RHZ) in the transfer function of the multi-stage amplifier, which arises from the signal path through amplifier circuit 16 and compensation network signal path around amplifier circuit 16, as described below in more detail.

Figure 2:
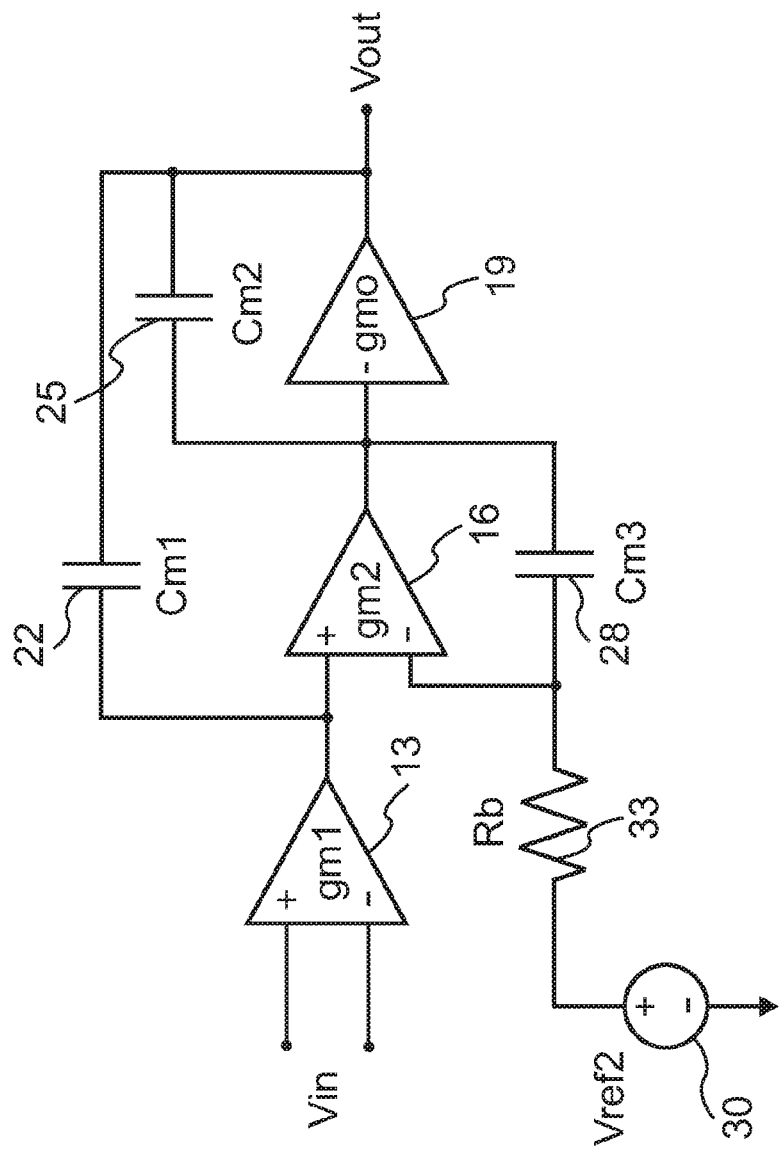
FIG. 2 depicts a block diagram of a compensated multi-stage amplifier according to another exemplary embodiment.

FIG. 2 depicts a block diagram of a compensated multi-stage amplifier according to another exemplary embodiment. Generally speaking, the multi-state amplifier in FIG. 2 has a similar topology to the multi-state amplifier in FIG. 1. In other words, the multi-state amplifier in FIG. 2 includes amplifier circuit 13, amplifier circuit 16, and amplifier circuit 19.

Compensation networks 22, 25, and 28 in FIG. 2, however, are more specific than the corresponding compensation networks in that compensation networks 22, 25, and 28 in FIG. 2 constitute capacitors. More specifically, compensation network 22 includes capacitor Cm1, compensation network 25 includes capacitor Cm2, and compensation network 28 includes capacitor Cm3.

In the exemplary embodiment of FIG. 2, amplifier circuit 13 has a transconductance gm1. Similarly, amplifier circuit 16 and amplifier circuit 19 have transconductances of gm2 and gm3, respectively.

Furthermore, in the exemplary embodiment of FIG. 2, amplifier circuit 13 has a dual-input (differential input) and single-ended output arrangement. Similarly, amplifier circuit 13 has a dual-input (differential input) and single-ended output arrangement. Amplifier circuit 19, however, has a single-ended input and a single-ended output.

Figure 3:
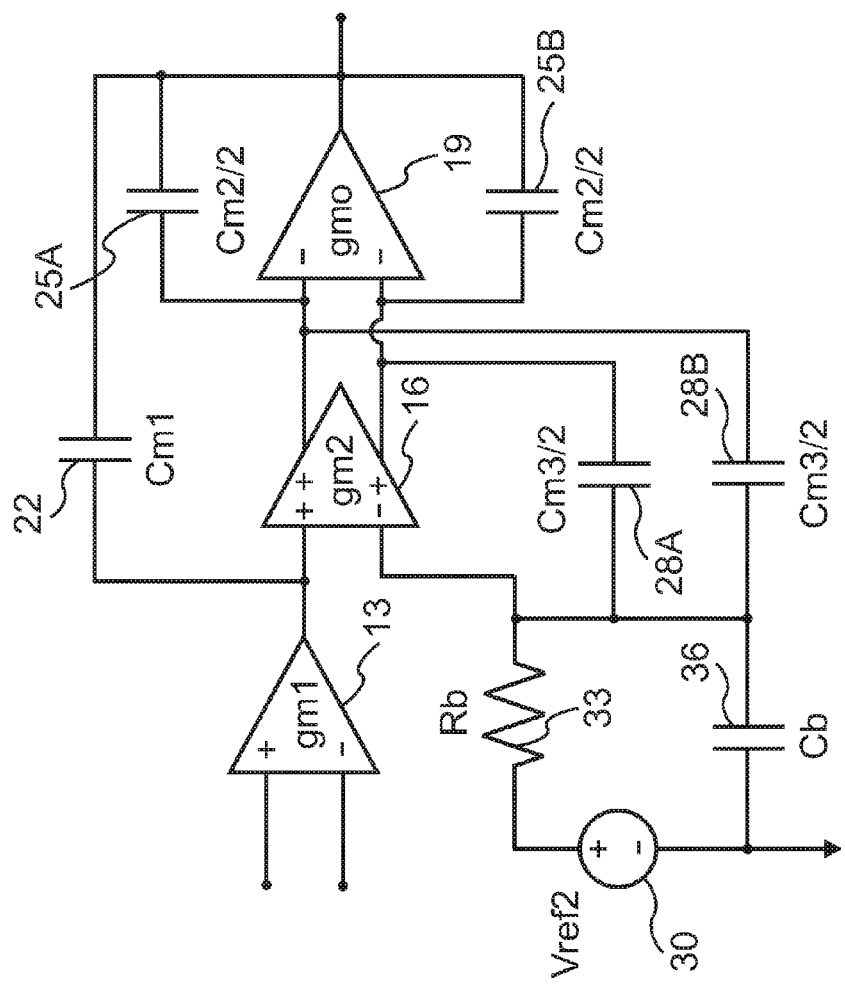
FIG. 3 shows a block diagram of a compensated multi-stage amplifier according to another exemplary embodiment.

Other amplifier arrangements are possible and contemplated, as persons of ordinary skill in the art will understand. FIG. 3 provides an example of an alternative embodiment, described below in detail.

As noted, in some embodiments, amplifier circuit 19 may constitute a class AB amplifier (for instance, amplifier circuit 19 in the embodiment shown in FIG. 2 may be such an amplifier). Compared to other types of amplifier, use of a class AB amplifier provides relatively good dynamic response and a lower DC bias current for the amplifier.

Furthermore, compared to other amplifiers, a class AB amplifier has relatively high output drive strength. The relatively high output drive strength allows driving loads with relatively capacitance. The higher output driver strength typically results from the use of physically larger transistors in class AB amplifiers that, when turned fully on, can provide higher output currents.

The circuit arrangement in FIG. 2 also includes resistor 33 (labeled "Rb"). The circuit arrangement in FIG. 2 further includes voltage source 30 (labeled "Vref2," i.e., a reference or bias voltage source for the second amplifier circuit, amplifier circuit 16). The function of resistor 33 and voltage source 30 is described below in detail.

Resistor 33 provides proper bias for amplifier circuit 16. Amplifier circuit 16 in FIG. 2 has two inputs. One input accepts the output signal of amplifier circuit 13. The other input is coupled to voltage source 30 through resistor 33. Voltage source 30 provides a proper DC operating point for amplifier circuit 16.

More specifically, amplifier circuit 13 typically has a relatively high gain (to improve the overall noise figure of the multi-stage amplifier). Thus, relatively small changes in the input signals of amplifier circuit 13 can result in relatively large changes in its output signal. The output of amplifier circuit 13 is DC-coupled to one of the inputs of amplifier circuit 16. Given that the output signal of amplifier circuit 16 responds to the difference between the signals at its respective inputs, in the absence of a bias signal at the inverting input, amplifier circuit 16 would lack a proper DC operating point. Voltage source 30 in combination with resistor 33 provides bias for amplifier circuit 16 and a proper DC operating point when the inputs are driven differentially.

Note that the combination of resistor 33 and capacitor 28 form a low-pass filter (LPF). The low-pass filter helps to reduce noise at the inverting input of amplifier circuit 16. As a result, the overall noise level of the multi-stage amplifier is reduced.

Capacitor 28 (CM3) helps to reduce noise contributed by voltage source 30 (Vref2). More specifically, without the use of capacitor 28, a dominant pole in the transfer function of the multi-stage amplifier is formed at a frequency that depends on gm1/CM1. When the loop around the multi-stage amplifier is closed (i.e., the output of the multi-stage amplifier is coupled to its output via a feedback path or network), at relatively low frequencies, the pole helps suppress noise in the circuitry following amplifier circuit 13.

At higher frequencies (higher than a frequency corresponding to gm1/CM1), however, the pole cannot effective suppress noise. The unsuppressed noise at the input of amplifier circuit 16 thus degrades the overall noise of the multi-stage amplifier.

The addition of capacitor 28 (CM3) to the multi-stage amplifier adds a lower-frequency. The pole corresponding to the addition of capacitor 28 filters noise at the input of amplifier circuit 28, for example, noise contributed by voltage source 30. Thus, the overall noise figure and noise performance of the multi-stage amplifier is improved by the addition of capacitor 28.

The addition of capacitor 28 also helps to improve the frequency response of the multi-stage amplifier (e.g., by improving the gain margin). In the absence of capacitor 28, two parallel signal paths exist between the output of amplifier circuit 16 and the output of the multi-stage amplifier.

One signal path includes amplifier circuit 19. The other signal path is formed by capacitor 25 (CM2). Both signal paths exhibit relatively high impedances in the frequency bands of interest (e.g., the bandwidth of the multi-stage amplifier).

If the two signal paths produce two respective signals that are 180 degrees of phase shift at the same amplitude, the two signals cancel each other. The signal cancellation results in a zero in the frequency response of the multi-stage amplifier at a certain frequency (or band of frequencies). That frequency is typically relatively close to the bandwidth of the multi-stage amplifier. The addition of capacitor 28 causes that frequency to be pushed out of the bandwidth of the multi-stage amplifier.

More specifically, the addition of capacitor 28 provides a relatively low-impedance (compared to the case where capacitor 28 is not included) path at the input of amplifier circuit 19. Thus, the addition of capacitor 28 provides a path between the input of amplifier circuit 19 and ground. As a result, the zero in the frequency response (see above) is decomposed, i.e., its affects are overcome, reduced, or removed.

As noted above, in exemplary embodiments, the disclosed compensation techniques (e.g., the addition of capacitor 28) may be employed in a variety of multi-stage amplifier configurations. FIG. 3 shows a block diagram of a compensated multi-stage amplifier as an example.

The multi-stage amplifier in FIG. 3 has a similar configuration to the multi-stage amplifiers in FIGS. 1 and 2 in that it includes amplifier circuit 13, amplifier circuit 16, amplifier circuit 19, voltage source 30, resistor 33, and capacitor 22. Similar to amplifier circuit 13 in FIG. 2, amplifier circuit 13 in FIG. 3 has two inputs and a single output.

Referring again to FIG. 3, amplifier circuit 16, however, has two outputs. The two outputs of amplifier circuit 16 respond with the same polarity of output signal to the difference between the two inputs of amplifier circuit 16. The output stage of amplifier circuit 16 is typically implemented with NMOS (N-type metal oxide semiconductor) and PMOS (P-type MOS) transistor networks. The two "+" symbols for the two outputs of amplifier circuit 16 indicate that the NMOS and PMOS transistor networks respond with the same output polarity to the difference in the respective inputs of amplifier circuit 16.

Similarly, amplifier circuit 19 in FIG. 3 has two inputs. The two inputs of amplifier circuit 19 provide the same polarity of output signal of amplifier circuit 19 in response to the two outputs of amplifier circuit 16. The input stage of amplifier circuit 19 is typically implemented with NMOS and PMOS transistor networks. The two "−" symbols for the two inputs of amplifier circuit 19 indicate that the NMOS and PMOS transistor networks respond with the same output polarity to the signals at the two inputs of amplifier circuit 19.

In addition, rather than using a single capacitor 25, the embodiment in FIG. 3 divides the capacitor into two capacitors 25A and 25B (each labeled CM2/2). Capacitor 25A couples between one of the inputs and the output of amplifier circuit 19. Capacitor 25B couples between the other input and the output of amplifier circuit 19. The division of the capacitor accommodates the dual-input configuration of amplifier circuit 19.

Similarly, rather than using a single capacitor 28, the embodiment in FIG. 3 divides the capacitor into two capacitors 28A and 28B (each labeled CM3/2). Capacitor 28A couples between one of the outputs and the inverting input of amplifier circuit 16. Capacitor 28B couples between the other output and the inverting input of amplifier circuit 19. The division of the capacitor accommodates the dual-output configuration of amplifier circuit 16.

In addition, the multi-stage amplifier in FIG. 3 may optionally include capacitor 36 (labeled Cb). If used, capacitor 36, in combination with resistor 33, forms an LPF. The LPF helps to provide a lower-impedance path to ground at the inputs of amplifier circuit 19.

As noted above, use of capacitor 28 (or generally, compensation network 28) improves the performance of multi-stage amplifiers according to exemplary embodiments. FIGS. 4-8 depict plots of various simulated characteristics of a compensated multi-stage amplifier according to an exemplary embodiment, for instance, an amplifier based on the embodiment of FIG. 2.

Figure 4:
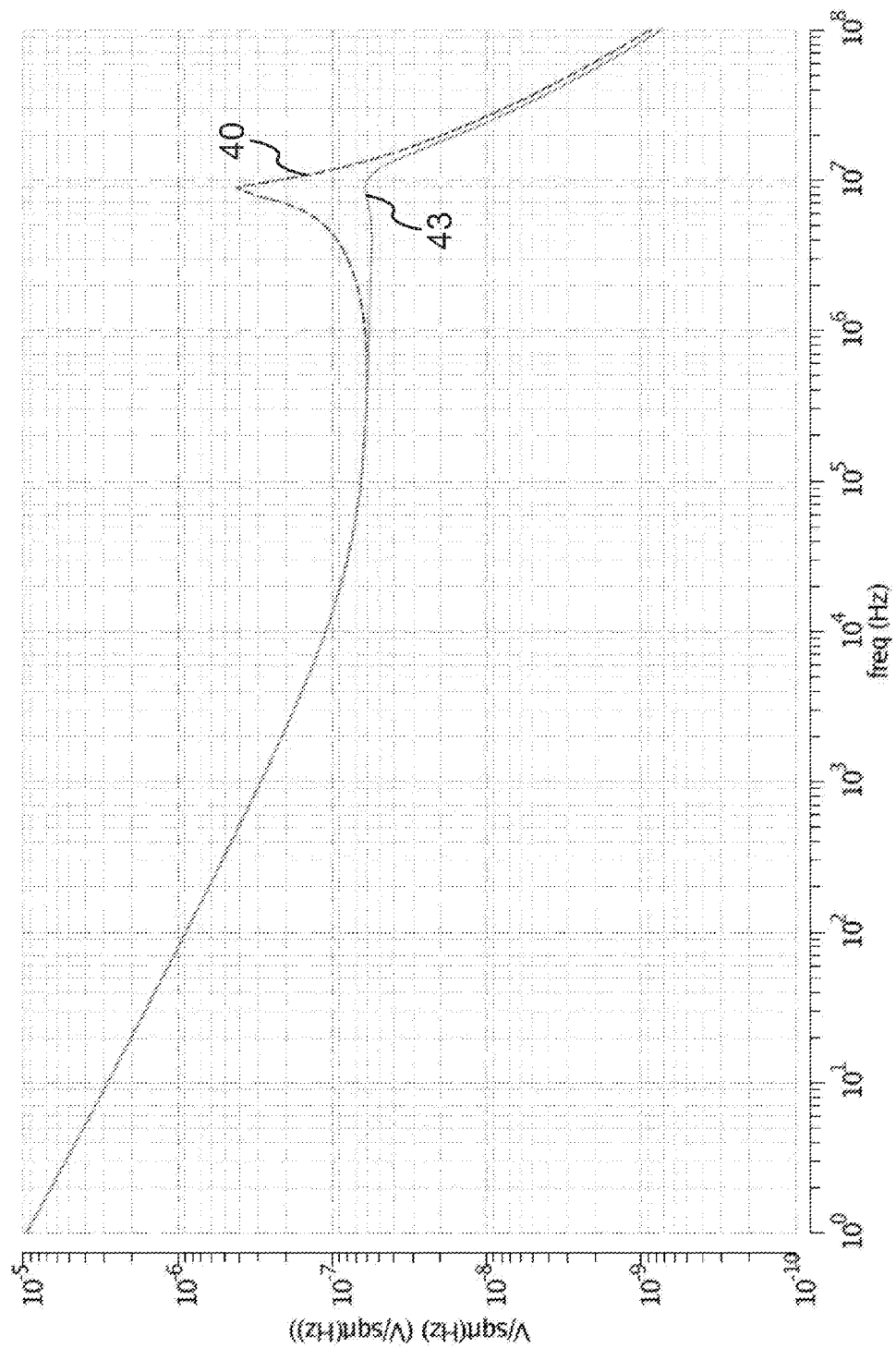
FIGS. 4-8 depict plots of various characteristics of a compensated multi-stage amplifier according to an exemplary embodiment.

FIG. 4 depicts a noise plot of such a multi-stage amplifier. The plot in FIG. 4 includes curve 40, which corresponds to the noise performance of the multi-stage amplifier without the use of capacitor 28. Curve 43, however, shows the noise performance of the multi-stage amplifier with capacitor 28 included in the circuit. A comparison of curve 43 with curve 40 shows that use of capacitor 28 removes the peaking that occurs in curve 40 at around 9 MHz.

As noted above, use of capacitor 28 (or generally, compensation network 28) improves the transfer function, frequency response, and/or loop stability of compensated multi-stage amplifiers according to exemplary embodiments. As an example, FIG. 5 illustrates a plot of the magnitude of the transfer function of the amplifier discussed above in connection with FIG. 4, when configured as a unity-gain buffer (e.g., by coupling the output of amplifier circuit 19 to an input of amplifier circuit 13 to form a negative feedback loop, as persons of ordinary skill in the art will understand).

Figure 5:
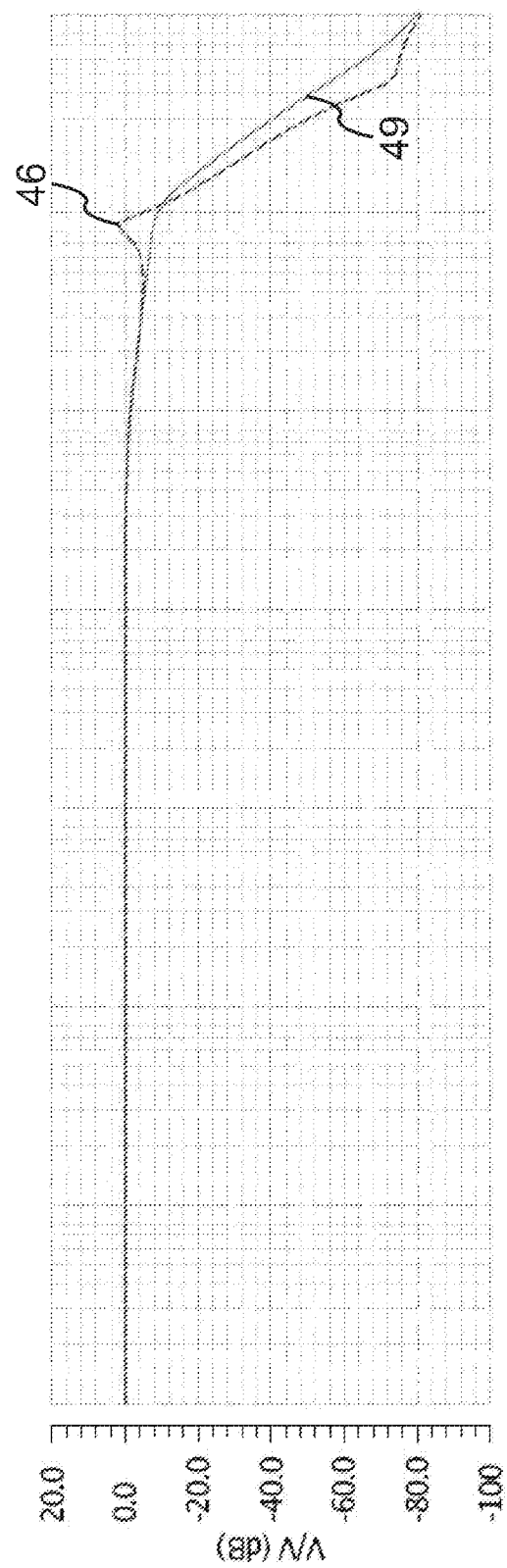

Referring to FIG. 5, the plot includes curve 46 and curve 49. Curve 46 illustrates the magnitude of the transfer function of the multi-stage amplifier without the use of capacitor 28. Curve 49, however, shows the magnitude of the transfer function of the multi-stage amplifier with capacitor 28 included in the circuit.

Figure 6:
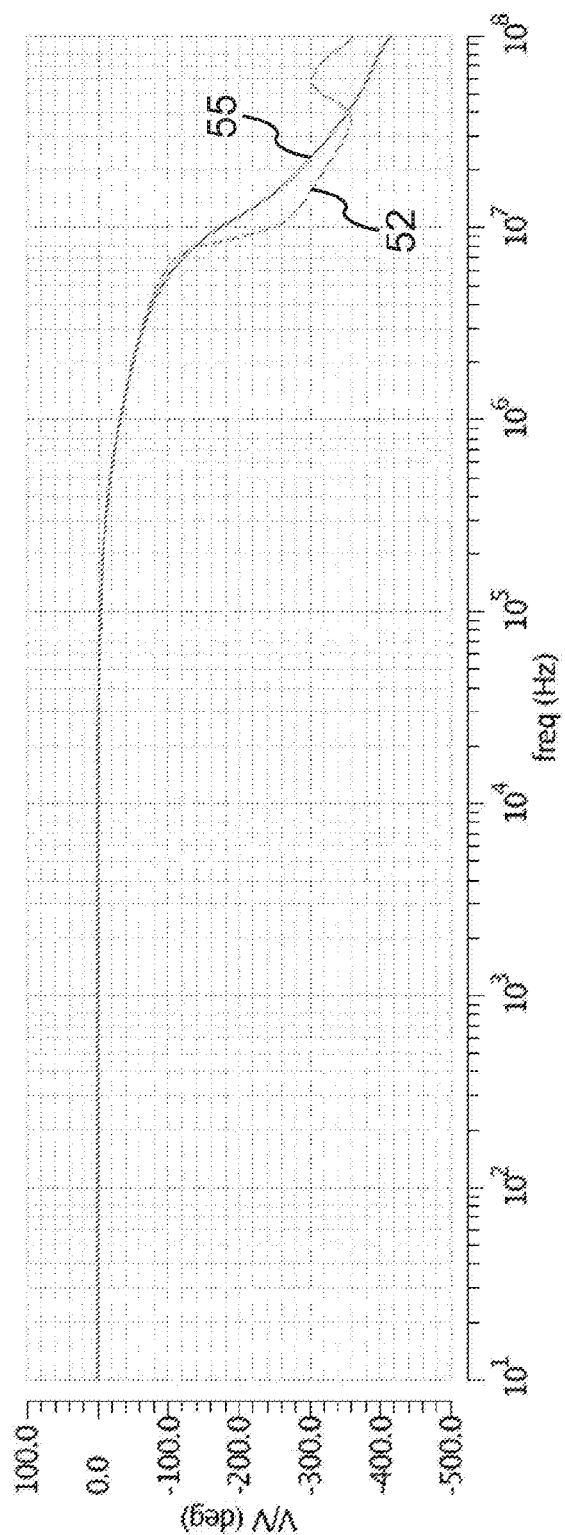

FIG. 6 depicts illustrates a plot of the phase of the transfer function of the amplifier discussed above in connection with FIG. 5. Specifically, the plot in FIG. 6 includes curve 52 and curve 58. Curve 52 illustrates the phase of the transfer function of the multi-stage amplifier without the use of capacitor 28. Curve 55, however, shows the phase of the transfer function of the multi-stage amplifier with capacitor 28 included in the circuit. As FIGS. 5-6 depicts, use of capacitor 28 improves the transfer function of the multi-stage amplifier.

Figure 7:
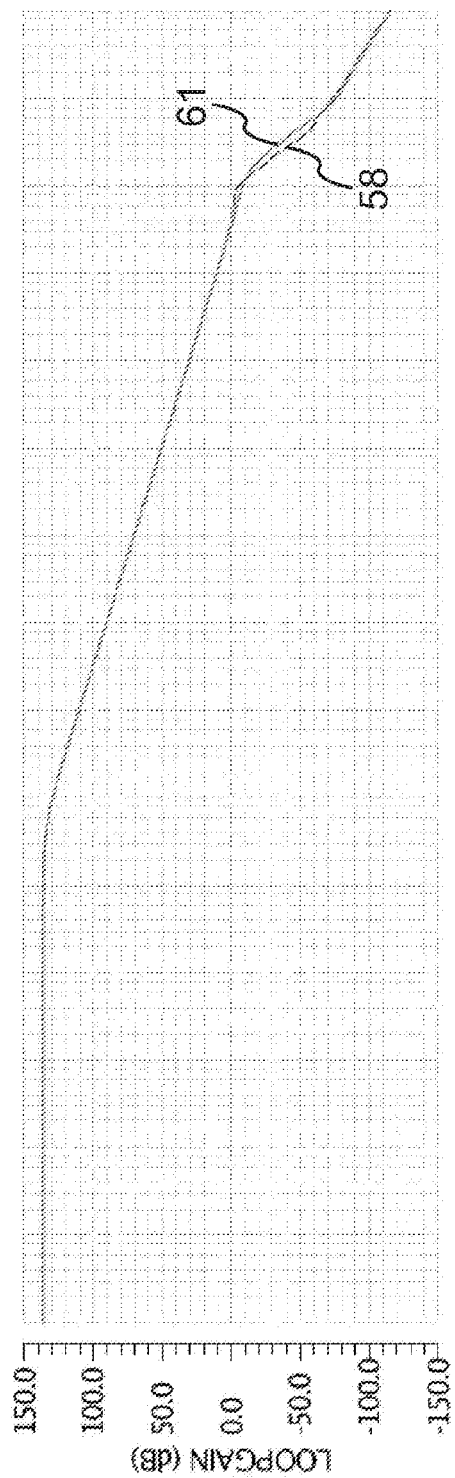
Figure 8:
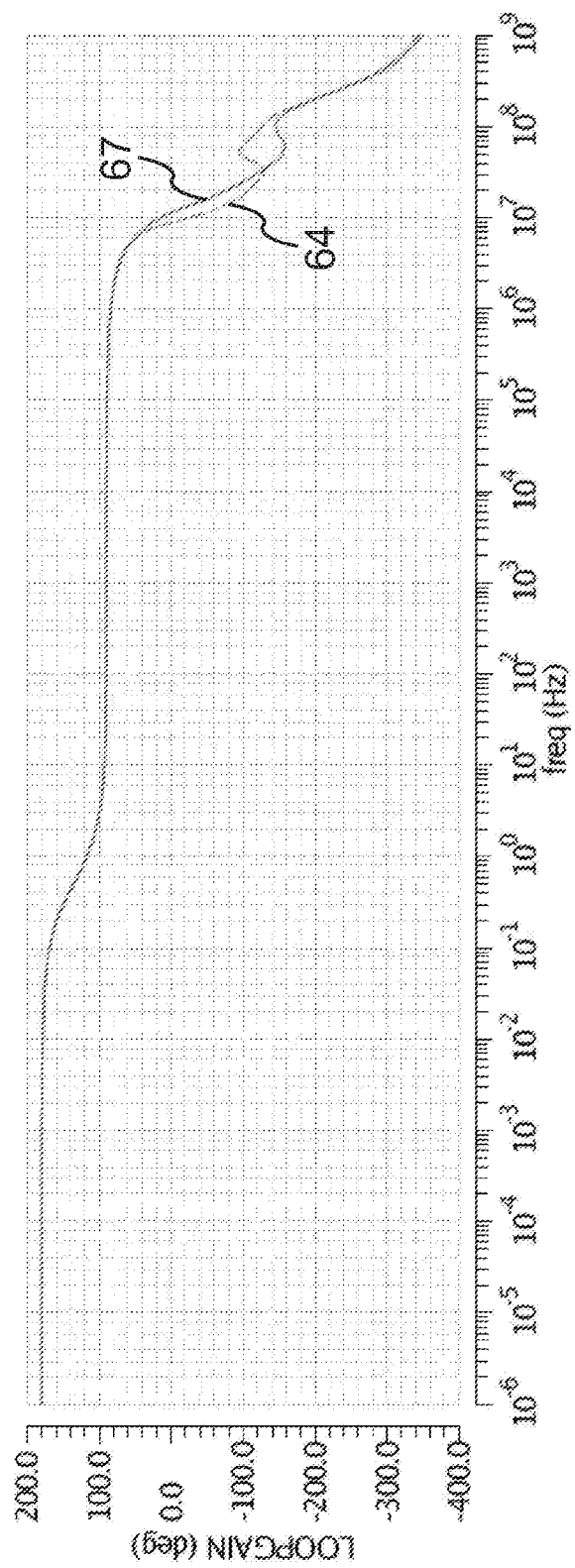

FIGS. 7-8 provide loop stability plots for the amplifier discussed above in connection with FIGS. 4-6. FIG. 7 illustrates a plot of the magnitude of the loop gain of the amplifier discussed above in connection with FIG. 5. Specifically, the plot in FIG. 7 includes curve 58 and curve 61. Curve 58 illustrates the magnitude of the loop gain of the multi-stage amplifier without the use of capacitor 28. Curve 61, however, shows the phase of the transfer function of the multi-stage amplifier with capacitor 28 included in the circuit.

FIG. 8 shows a plot of the phase of the loop gain of the amplifier discussed above in connection with FIG. 5. Specifically, the plot in FIG. 7 includes curve 64 and curve 67. Curve 64 illustrates the phase without the use of capacitor 28. Curve 67, however, shows the phase with capacitor 28 included in the circuit.

As FIGS. 7-8 depict, use of capacitor 28 improves the loop gain of the multi-stage amplifier. More specifically, although the phase margin is changed relatively little by the addition of capacitor 28, the gain margin is improved by the addition of capacitor 28, which leads to the removal of the RHZ, as described above.

Figure 9:
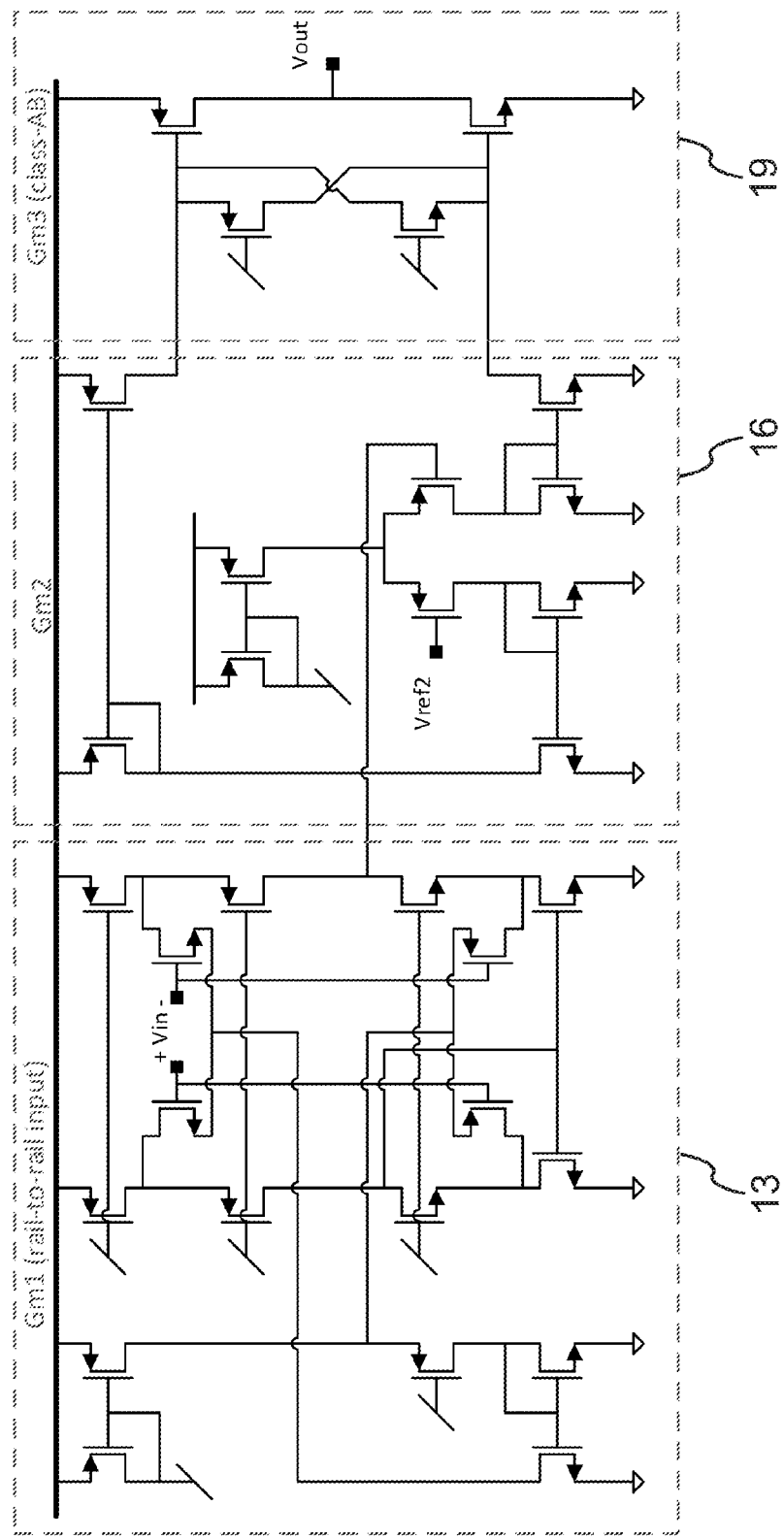
FIG. 9 depicts a circuit schematic for a multi-stage amplifier according to an exemplary embodiment.

Compensated multi-stage amplifiers according to exemplary embodiments may be implemented in a variety of ways, as desired. FIG. 9 depicts a circuit schematic for a multi-stage amplifier according to an exemplary embodiment. The details of operation of the circuit in FIG. 9 will be understood by persons of ordinary skill in the art. A brief description is provided below.

Referring to FIG. 9, the embodiment shown includes the cascade arrangement of amplifier circuit 13 (labeled Gm1), amplifier circuit 16, and amplifier circuit 19, implemented in complementary MOS (CMOS). Amplifier circuit 13 includes a differential pair combined with bias circuitry and circuitry that accommodates rail-to-rail input. Amplifier circuit 16 has two inputs, and a single output, similar to the embodiment of FIG. 2.

Referring again to FIG. 9, amplifier circuit 16 (labeled Gm2) has a single input, and a single output, similar to the embodiment of FIG. 2. Amplifier circuit 16 in FIG. 9 includes a differential pair driven by the output of amplifier circuit 13 and voltage Vref2. Amplifier circuit 16 also includes bias circuitry.

Amplifier circuit 19 (labeled Gm3) has a single input, and a single output. Amplifier circuit 19 includes cross-coupled PMOS and NMOS transistors. Amplifier circuit 19 constitutes a class AB amplifier. The output of amplifier circuit 19 provides the output signal of the multi-stage amplifier. Note that the multi-stage amplifier in FIG. 9 may be compensated as described above, for example, by adding compensation networks 22, 25, and 28 (which may be capacitors or other network or circuit, as described above).

Multi-stage amplifiers according to exemplary embodiments, such as the embodiment shown in FIG. 9, may be included and integrated in an integrated circuit (IC). Such an IC may include other circuitry, such as bias circuitry, input/output (I/O) circuitry (to provide a communication mechanism for the input and/or output signals of the multi-stage amplifier), and the like, as persons of ordinary skill in the art will understand.

Multi-stage amplifiers according to exemplary embodiments, including amplifiers integrated in an IC, may be used in a variety of circuits, blocks, subsystems, and systems, as desired. Without limitation, examples include general-purpose amplifiers, rail-to-rail amplifiers, low-noise amplifiers, analog-to-digital converters (ADCs), digital-to-analog converters (DACs), comparators, filters, analog signal-processing circuitry, power amplifiers, etc.

Although noise performance improvement is described with respect to the inclusion of capacitor 28 (generally, compensation network 28), other circuits may be used in addition to or instead of capacitor 28 in multi-stage amplifiers. For example, in some embodiments, an LPF may be used.

Although using an LPF would improve the overall noise performance of a multi-stage amplifier, it nevertheless uses relatively large values of components, such as resistors and capacitors. In an IC implementation, the physical sizes of the components (and their impact on the IC floor-plan size) may be taken into account in deciding whether to use an LPF instead of or in addition to capacitor 28.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only. Where applicable, the figures might or might not be drawn to scale, as persons of ordinary skill in the art will understand.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:
1. An apparatus comprising:
 a multi-stage amplifier comprising:
  first, second, and third amplifier circuits coupled in a cascade configuration;
  a bias voltage source coupled to an inverting input of the second amplifier circuit via a resistor to provide a DC operating point for the second amplifier circuit; and first, second, and third compensation networks, wherein the first compensation network is coupled between the output of the third amplifier circuit and a non-inverting input of the second amplifier circuit, the second compensation network is coupled between the output of the third amplifier circuit and the input of the third amplifier circuit, and the third compensation network is coupled between the output of the second amplifier circuit and the inverting input of the second amplifier circuit.

2. The apparatus according to claim 1, wherein the first amplifier circuit is DC coupled to the second amplifier circuit.

3. The apparatus according to claim 2, wherein the second amplifier circuit is DC coupled to the third amplifier circuit.

4. The apparatus according to claim 1, wherein the third compensation network comprises a first capacitor.

5. The apparatus according to claim 4, wherein the first capacitor removes a right-hand-zero of a transfer function of the multi-stage amplifier.

6. The apparatus according to claim 4, wherein the first capacitor reduces a noise level of the multi-stage amplifier.

7. The apparatus according to claim 4, wherein the first capacitor improves a gain margin of the multi-stage amplifier.

8. The apparatus according to claim 4, wherein the second compensation network comprises a second capacitor.

9. The apparatus according to claim 8, wherein the first compensation network comprises a third capacitor.

10. The apparatus according to claim 9, comprising an integrated circuit (IC), wherein the multi-stage amplifier is integrated in the IC.

11. A multi-stage amplifier comprising:
a first amplifier circuit having first and second inputs and an output, the first amplifier circuit coupled to receive an input signal of the compensated multi-stage amplifier at the first input of the first amplifier circuit;
a second amplifier circuit having first and second inputs and an output, the first input of the second amplifier circuit coupled to the output of the first amplifier circuit;
a third amplifier circuit having an input and an output, the input of the third amplifier circuit coupled to the output of the second amplifier circuit, the output of the third amplifier circuit to provide an output signal of the multi-stage amplifier;
a first capacitor coupled between the output of the third amplifier circuit and the first input of the second amplifier circuit;
a second capacitor coupled between the output of the third amplifier circuit and the input of the third amplifier circuit; and
a third capacitor coupled between the output of the second amplifier circuit and the second input of the second amplifier circuit.

12. The multi-stage amplifier according to claim 11, wherein the third capacitor reduces a noise level of the multi-stage amplifier.

13. The multi-stage amplifier according to claim 11, wherein the third capacitor removes a right-hand-zero of a transfer function of the multi-stage amplifier.

14. The multi-stage amplifier according to claim 11, further comprising a voltage source coupled to the second input of the second amplifier via a resistor.

15. The multi-stage amplifier according to claim 14, wherein the second amplifier circuit is DC coupled to the first amplifier circuit, and wherein the third amplifier circuit is DC coupled to the second amplifier circuit.

16. A method of compensating a multi-stage amplifier that includes first, second, and third amplifier circuits coupled in a cascade configuration, the method comprising:
compensating the multi-stage amplifier by using a first compensation network coupled between the output of the third amplifier circuit and a non-inverting input of the second amplifier circuit;
compensating the multi-stage amplifier by using a second compensation network is coupled between the output of the third amplifier circuit and the input of the third amplifier circuit;
compensating the multi-stage amplifier by using a third compensation network coupled between the output of the second amplifier circuit and an inverting input of the second amplifier circuit; and
providing a DC operating point for the second amplifier circuit by coupling a bias voltage source coupled to the inverting input of the second amplifier circuit via a resistor.

17. The method according to claim 16, wherein the second amplifier circuit is DC coupled to the first amplifier circuit, and wherein the third amplifier circuit is DC coupled to the second amplifier circuit.

18. The method according to claim 16, wherein the first, second, and third compensation networks comprise, respectively, first, second, and third capacitors.

19. The method according to claim 18, wherein the third capacitor removes a right-hand-zero of a transfer function of the multi-stage amplifier.

20. The method according to claim 18, wherein the third capacitor reduces a noise level at the output of the third amplifier circuit.

* * * * *